United States Patent
Yu et al.

(10) Patent No.: US 11,626,410 B2
(45) Date of Patent: Apr. 11, 2023

(54) SILICON-CONTAINING LAYER FOR BIT LINE RESISTANCE REDUCTION

(71) Applicant: Applied Materials, Inc., Santa Clara, CA (US)

(72) Inventors: Tom Ho Wing Yu, Campbell, CA (US); Nobuyuki Sasaki, Cupertino, CA (US); Jianxin Lei, Fremont, CA (US); Wenting Hou, San Jose, CA (US); Rongjun Wang, Dublin, CA (US); Tza-Jing Gung, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/861,412

(22) Filed: Jul. 11, 2022

(65) Prior Publication Data

US 2022/0406790 A1   Dec. 22, 2022

Related U.S. Application Data

(63) Continuation of application No. 17/351,223, filed on Jun. 17, 2021.

(51) Int. Cl.
*H01L 27/108* (2006.01)

(52) U.S. Cl.
CPC .. *H01L 27/10885* (2013.01); *H01L 27/10805* (2013.01)

(58) Field of Classification Search
CPC ......... H01L 27/10885; H01L 27/10805; H01L 29/4236; H01L 27/10814; H01L 27/10823; H01L 27/1085; H01L 27/10876; H01L 27/10855
See application file for complete search history.

(56) References Cited

U.S. PATENT DOCUMENTS

| | | |
|---|---|---|
| 6,008,084 A | 12/1999 | Sung |
| 6,282,118 B1 | 8/2001 | Lung et al. |
| 6,282,188 B1 | 8/2001 | Lung et al. |
| 6,287,914 B1 | 9/2001 | Uchiyama et al. |

(Continued)

FOREIGN PATENT DOCUMENTS

JP    2000311885 A    11/2000

OTHER PUBLICATIONS

PCT International Search Report and Written Opinion in PCT/US2022/033926 dated Oct. 13, 2022, 8 pages.

*Primary Examiner* — Mohammed R Alam
(74) *Attorney, Agent, or Firm* — Servilla Whitney LLC

(57) ABSTRACT

Bit line stacks and methods of forming bit line stacks are described herein. A bit line stack comprises: a polysilicon layer; an adhesion layer on the polysilicon layer; a barrier metal layer on the adhesion layer; an interface layer on the barrier metal layer; a resistance reducing layer on the interface layer; and a conductive layer on the resistance reducing layer. A bit line stack having the resistance reducing layer has a resistance at least 5% lower than a comparable bit line stack without the resistance reducing layer. The resistance reducing layer may include silicon oxide or silicon nitride. The resistance reducing layer may be formed using one or more of a physical vapor deposition (PVD), a radio frequency-PVD, a pulsed-PVD, chemical vapor deposition (CVD), atomic layer deposition (ALD) or sputtering process.

16 Claims, 2 Drawing Sheets

(56) References Cited

U.S. PATENT DOCUMENTS

| | | | |
|---|---|---|---|
| 6,621,110 | B1 | 9/2003 | Matsuoka et al. |
| 7,256,441 | B2 | 8/2007 | Kang et al. |
| 8,547,729 | B2 | 10/2013 | Huang |
| 9,947,669 | B1 | 4/2018 | Takesako et al. |
| 2002/0187598 | A1 | 12/2002 | Park et al. |
| 2009/0029539 | A1 | 1/2009 | Sung et al. |
| 2012/0306081 | A1 | 12/2012 | Ishizaki et al. |
| 2018/0190662 | A1 | 7/2018 | Wu et al. |
| 2020/0126844 | A1 | 4/2020 | Panda et al. |
| 2022/0085025 | A1* | 3/2022 | Lim ................... H01L 27/10814 |
| 2022/0173108 | A1* | 6/2022 | Lee ................... H01L 27/10814 |

* cited by examiner

SILICON-CONTAINING LAYER FOR BIT LINE RESISTANCE REDUCTION

CROSS-REFERENCE TO RELATED APPLICATION

This application claims priority to U.S. Provisional application Ser. No. 17/351,223, filed Jun. 17, 2021, the entire disclosure of which is hereby incorporated by reference herein.

TECHNICAL FIELD

Embodiments of the present disclosure pertain to the field of electronic devices and electronic device manufacturing. More particularly, embodiments of the disclosure provide electronic devices including a bit line with reduced resistance and methods of forming same.

BACKGROUND

The electrically-conductive interconnect layers of modern integrated circuits are generally of very fine pitch and high density. A single, small defect in the precursor metal film which ultimately forms a metallic interconnect layer of an integrated circuit can be so positioned as to seriously damage the operational integrity of the integrated circuit.

Bit line stack deposition suffers from a number of potential issues. Surface reaction of the adhesion layer and each of the barrier metal and interface layers can occur due to high deposition temperatures experienced in the formation of the bit line stack. The bit line resistance can increase due to inter-diffusion of silicon into the adhesion layer and metal atoms into the bit line stack. Additionally, grain growth metals can be difficult to use due to metal surface roughness caused by high temperature bit line stack formation.

Therefore, there is a need in the art for bit line stacks and/or methods of forming bit lines with lower resistivity.

SUMMARY

One or more embodiments of the disclosure are directed to a bit line stack. The bit line stack comprises a polysilicon layer; an adhesion layer on the polysilicon layer; a barrier metal layer on the adhesion layer; an interface layer on the barrier metal layer; a resistance reducing layer on the interface layer; and a conductive layer on the resistance reducing layer.

Additional embodiments of the disclosure are directed to methods of forming a bit line stack. The method comprises forming an adhesion layer on a polysilicon layer; forming a barrier metal layer on the adhesion layer; forming an interface layer on the barrier metal layer; forming a silicon oxide resistance reducing layer on the interface layer; and forming a conductive layer on the silicon oxide resistance reducing layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Bit line stacks and methods for forming bit line stacks with reduced resistance are provided. One or more embodiments of the disclosure advantageously address the issue of resistivity reduction in spite of the need for shrinking nodes. In some embodiments, the resistivity of the bit line is reduced by providing cleaner interfaces with existing bit line metals and by changing the bit line metal. Some embodiments of the disclosure provide methods for forming bitline stacks with reduced resistance. Some embodiments of the disclosure provide bitline stack with reduced resistance that incorporate a dielectric material. One or more embodiments provide bitline stacks with a silicon oxide layer that results in a reduction in the resistance greater than or equal to 5%, 7.5% or 10% when compared to a bitline stack without the silicon oxide layer.

Some embodiments of the disclosure provide methods of reducing bit line stack resistivity using a silicon oxide layer. In one or more embodiments, a bit line stack has a resistance at least 5% lower than a comparable bit line stack without the silicon oxide layer. Some embodiments of the disclosure advantageously provide deposition processes at low pressures (e.g., 0.1 mTorr to 5 mTorr). Some embodiments provide compatible deposition processes with underlying bit line metals to minimize or eliminate surface reactions during film deposition.

One or more embodiments of the disclosure generally provide structures which include one or more low-resistivity features formed from a thin film refractory metal (e.g., tungsten) as may be implemented in bit line structures and/or gate stacks. Some embodiments include methods for forming bit line stacks. By way of example, a bit line stack structure formed in accordance with embodiments of the present disclosure may be a memory type semiconductor device, such as a DRAM type integrated circuit.

Figure 1:
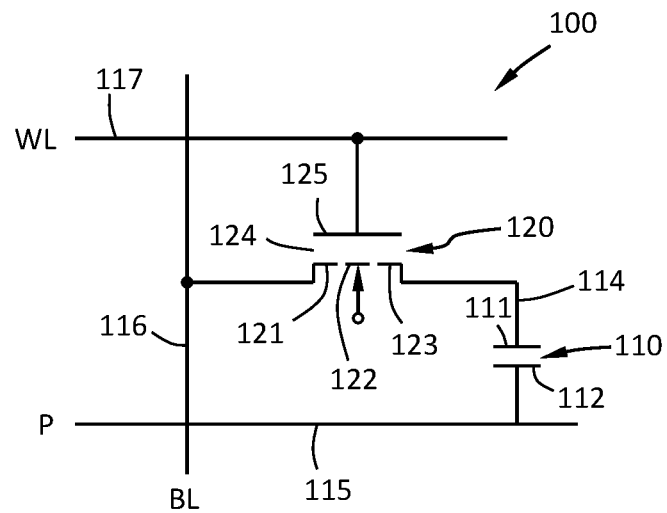
FIG. 1 illustrates a circuit diagram of a dynamic memory cell in a DRAM memory having improved properties in accordance with one or more embodiments of the present disclosure.

FIG. 1 illustrates a schematic circuit diagram of a one transistor one capacitor cell such as may be used in DRAM memories. The memory cell depicted in FIG. 1 comprises a storage capacitor 110 and a selection transistor 120. The selection transistor 120 is formed as a field effect transistor and has a first source/drain electrode 121 and a second source/drain electrode 123 between which an active region 122 is arranged. Above the active region 122 are the gate insulating layer or dielectric layer 124, typically a thermally grown oxide, and gate electrode/metal 125 (called word line in memory devices), together which act like a plate capacitor and can influence the charge density in the active region 122 in order to form or block a current conducting channel between the first source/drain electrode 121 and the second source/drain electrode 123.

The second source/drain electrode 123 of the selection transistor 120 is connected to a first electrode 111 of the storage capacitor 110 via a metal line 114. A second electrode 112 of the storage capacitor 110 is in turn connected to a capacitor plate which may be common to storage capacitors of the DRAM memory cell arrangement. The second electrode 112 of storage capacitor 110 can be connected to electrical ground via metal line 115. The first source/drain electrode 121 of the selection transistor 120 is furthermore connected to a bit line 116 in order that the information stored in storage capacitor 110 in the form of charges can be written in and read out. The write in or read out operation is controlled via a word line 117 or gate electrode 125 of the selection transistor 120 and bit line 116 which is connected to the first source/drain electrode 121. The write in or read out operation occurs by applying a voltage to produce a current conducting channel in the active region 122 between the first source/drain electrode 121 and the second source/drain electrode 123.

Figure 2:
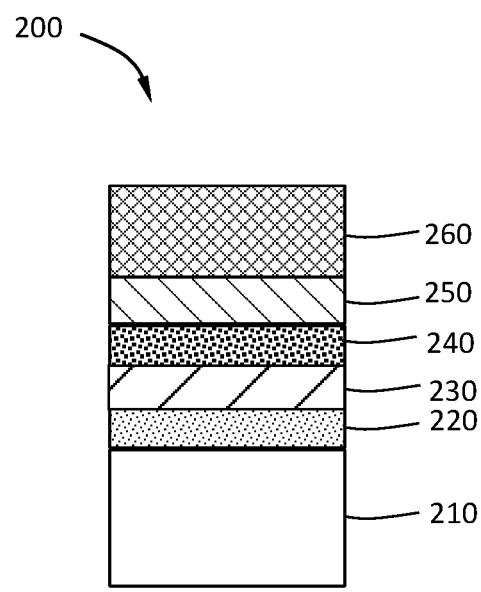
FIG. 2 illustrates a schematic representation of a bit line stack according to one or more embodiments.
Figure 3:
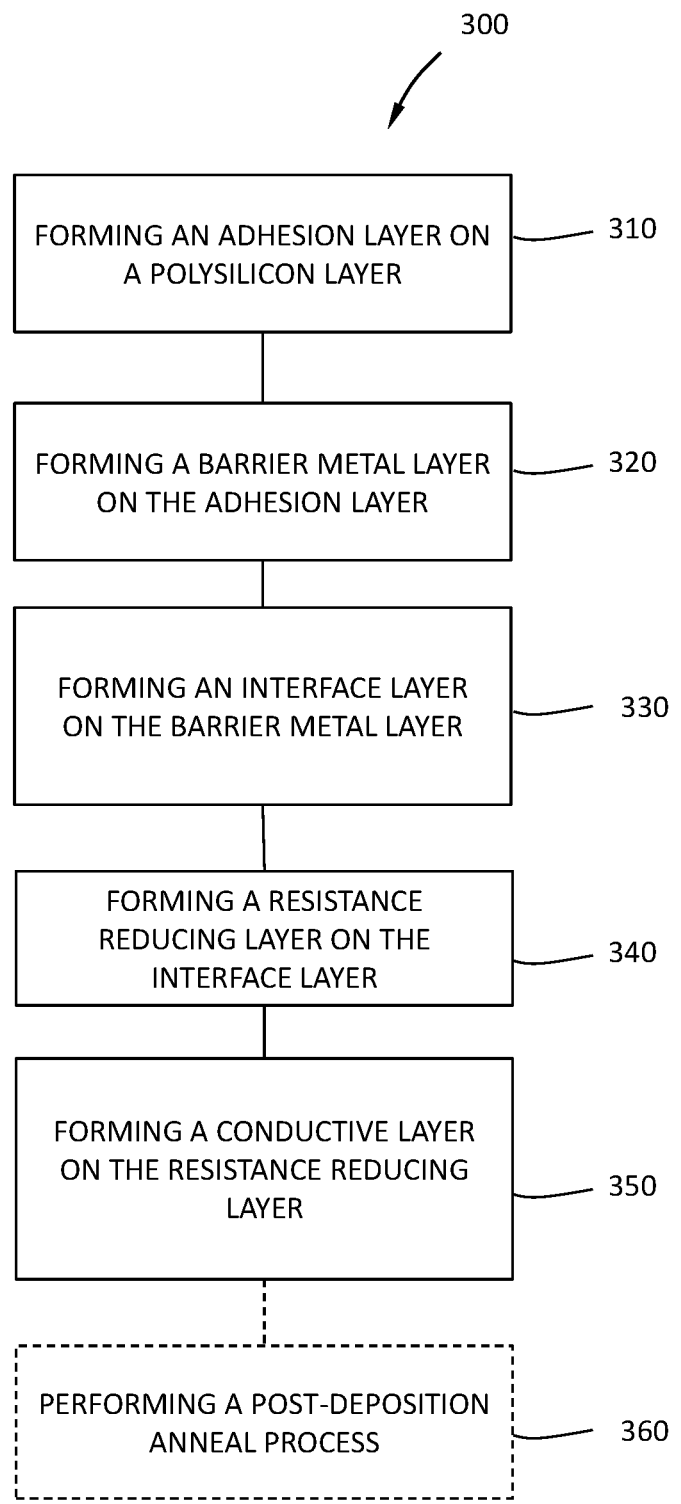
FIG. 3 illustrates a flowchart method for forming a bit line stack according to one or more embodiments.

FIG. 2 illustrates a portion of a bit line stack 200 in accordance with one or more embodiment of the disclosure. FIG. 3 illustrates an exemplary method 300 for forming the bit line stack 200 illustrated in FIG. 2. The skilled artisan will recognize that the bit line stacks illustrated in the drawings are an exemplary portion of a memory device.

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

Referring to FIG. 2, a bit line stack is shown. In some embodiments, the bit line stack 200 comprises a polysilicon layer 210 (which may also be referred to herein as a substrate); an adhesion layer 220 on the polysilicon layer 210; a barrier metal layer 230 on the adhesion layer 220; an interface layer 240 on the barrier metal layer 230; a resistance reducing layer 250 (e.g., a silicon oxide layer or a silicon nitride layer) on the interface layer 240; and a conductive layer 260 on the resistance reducing layer 250 (e.g., a silicon oxide layer or a silicon nitride layer).

In some embodiments, the adhesion layer 220 can be any suitable conductive material. In some embodiments, the adhesion layer 220 comprises one or more of titanium (Ti), tantalum (Ta), titanium silicide (TiSi), tantalum silicide (TaSi) or cobalt silicide (CoSi). In some embodiments, the adhesion layer 220 comprises titanium. In some embodiments, the adhesion layer 220 consists essentially of titanium. In some embodiments, the adhesion layer 220 comprises or consists essentially of tantalum. In some embodiments, the adhesion layer 220 comprises or consists essentially of titanium silicide. In some embodiments, the adhesion layer 220 comprises or consists essentially of tantalum silicide. In some embodiments, the adhesion layer 220 comprises or consists essentially of titanium. As used in this manner, the term "consists essentially of" means that the subject film comprises greater than or equal to about 95%, 98%, 99% or 99.9% of the stated element or composition, on an atomic basis. For example, an adhesion layer 220 consisting essentially of titanium has a film that is greater than or equal to about 95%, 98%, 99% or 99.5% titanium as deposited.

In some embodiments, the adhesion layer 220 has a thickness in a range of from 10 Å to 30 Å. In some embodiments, the adhesion layer 220 has a thickness in a range of from 20 Å to 30 Å. In one or more embodiments, the adhesion layer 220 can be formed by any suitable process known to the skilled artisan. In some embodiments, the adhesion layer 220 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing. In one or more embodiments, the adhesion layer 220 is deposited using PVD.

In some embodiments, the barrier metal layer 230 comprises tungsten nitride (WN). In one or more embodiments, the WN of the barrier metal layer 230 and the Ti of the adhesion layer 220 form TiN as a barrier. In some embodiments, the barrier metal layer 230 has a thickness in a range of from 10 Å to 30 Å. In some embodiments, the barrier metal layer 230 has a thickness in a range of from 20 Å to 30 Å.

In some embodiments, the interface layer 240 comprises one or more of tungsten silicide (WSi) or tungsten silicon nitride (WSiN). In some embodiments, the interface layer 240 comprises or consists essentially of tungsten silicide (WSi). In some embodiments, the interface layer 240 comprises or consists essentially of tungsten silicon nitride (WSiN). For example, an interface layer 240 consisting essentially of tungsten silicide (WSi) means that the sum of the tungsten and silicon atoms in the film make up greater than or equal to about 95%, 98%, 99% or 99.5% of the interface layer 240 on an atomic basis as deposited. In some embodiments, the N of WSiN prevents W diffusion. In some embodiments, the interface layer 240 has a thickness in a range of from 10 Å to 30 Å. In some embodiments, the interface layer 240 has a thickness in a range of from 20 Å to 30 Å.

In some embodiments, the bit line stack 200 optionally includes a barrier layer (not shown) on the adhesion layer 220. The barrier layer can be formed between the adhesion layer 220 and the interface layer 20. The barrier layer can be any suitable barrier layer material. In some embodiments, the barrier layer comprises one or more of a nitride or an oxide of the adhesion layer 220. In some embodiments, the barrier layer consists essentially of a nitride of the adhesion layer 220. For example, a barrier layer consisting essentially of titanium nitride means that the sum of the titanium and nitrogen atoms in the film make up greater than or equal to about 95%, 98%, 99% or 99.5% of the barrier layer on an atomic basis as deposited.

In some embodiments, the adhesion layer 220 comprises titanium (Ti) and the barrier layer comprises titanium nitride (TiN). In some embodiments, the adhesion layer 220 consists essentially of titanium (Ti) and the barrier layer consists essentially of titanium nitride (TiN). In one or more embodiments, the adhesion layer 220 comprises a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W). In one or more specific embodiments, the adhesion layer 220 (conductive material) comprises one or more of titanium (Ti), copper (Cu), cobalt (Co), tungsten (W), or ruthenium (Ru). In some embodiments, the barrier layer comprises a nitride, oxynitride, carbonitride, or oxy-carbonitride of the metal in adhesion layer 220. In some embodiments, the adhesion layer 220 comprises (or consists essentially of) tantalum (Ta) or tantalum silicide (TaSi) and the barrier layer comprises (or consists essentially of) tantalum nitride (TaN). In some embodiments, the adhesion layer 220 comprises (or consists essentially of) titanium (Ti) or titanium silicide (TiSi) and the barrier layer comprises (or consists essentially of) titanium nitride (TiN).

In some embodiments, the bit line stack 200 comprises a resistance reducing layer 250 (e.g., a silicon oxide layer or a silicon nitride layer). In some embodiments, the resistance reducing layer 250 (e.g., a silicon oxide layer or a silicon nitride layer) is deposited using a deposition technique, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing. In one or more embodiments, the resistance reducing layer 250 (e.g., a silicon oxide layer or a silicon nitride layer) is deposited using PVD.

The resistance reducing layer 250 can be any suitable material known to the skilled artisan. In some embodiments, the resistance reducing layer 250 comprises or consists essentially of silicon oxide (SiO$_2$). As used herein, the term "consists essentially of" means that the resistance reducing layer has a sum of silicon and oxygen atoms greater than or equal to 95%, 98% or 99%. In one or more embodiments, the resistance reducing layer 250 comprises or consists essentially of silicon nitride (SiN). As used herein, the term "consists essentially of" means that the resistance reducing layer has a sum of silicon and nitrogen atoms greater than or equal to 95%, 98% or 99%. In one or more embodiments, the resistance reducing layer 250 (e.g., a silicon oxide layer or a silicon nitride layer) is formed using a PVD process comprising a silicon target and an oxygen or a nitrogen plasma. In one or more embodiments, the resistance reducing layer 250 (e.g., a silicon oxide layer or a silicon nitride layer) is formed using a pulsed-PVD process comprising a silicon target and an oxygen or a nitrogen plasma. In one or more embodiments, the resistance reducing layer 250 (e.g., a silicon oxide layer or a silicon nitride layer) is formed using a PVD process comprising a silicon oxide target and an argon plasma. In one or more embodiments, the resistance reducing layer 250 (e.g., a silicon oxide layer or a silicon nitride layer) is formed using an RF-PVD process comprising a silicon oxide target or a silicon nitride target and an argon plasma. In one or more embodiments, the resistance reducing layer 250 (e.g., a silicon oxide layer or a silicon nitride layer) is formed by sputtering an inert gas comprising one or more of argon (Ar), krypton (Kr) or neon (Ne). In one or more embodiments, the resistance reducing layer 250 (e.g., a silicon oxide layer or a silicon nitride layer) is formed using a CVD process. In one or more embodiments, the resistance reducing layer 250 (e.g., a silicon oxide layer or a silicon nitride layer) is formed using an ALD process.

In some embodiments, the resistance reducing layer 250 (e.g., a silicon oxide layer or a silicon nitride layer) has a thickness in a range of from 2 Å to 30 Å, or 5 Å to 20 Å, or 10 Å to 15 Å. In some embodiments, the resistance reducing layer 250 (e.g., a silicon oxide layer or a silicon nitride layer) has a thickness of 5 Å. In some embodiments, the resistance reducing layer 250 (e.g., a silicon oxide layer or a silicon nitride layer) is amorphous.

In some embodiments, the resistance reducing layer 250 (e.g., a silicon oxide layer or a silicon nitride layer) reduces resistance of the bit line stack 200. In some embodiments, the bit line stack 200 has a resistance at least 5% lower than a comparable bit line stack without the resistance reducing layer 250 (e.g., a silicon oxide layer or a silicon nitride layer). In some embodiments, the bit line stack 200 has a resistance at least 5%, 6%, 7%, 8%, 9%, 10%, 11%, 12%, 13%, 14% or 15% lower than a comparable bit line stack without the resistance reducing layer 250 (e.g., a silicon oxide layer or a silicon nitride layer). In some embodiments, the comparable bit line stack without the resistance reducing layer 250 (e.g., a silicon oxide layer or a silicon nitride layer) has a sheet resistance of about 6 ohms per square Ω/cm. In some embodiments, the bit line stack 200 comprising the resistance reducing layer 250 (e.g., a silicon oxide layer or a silicon nitride layer) on the interface layer 240 has a sheet resistance of about 5.4 Ω/cm.

In one or more embodiments, the resistance reducing layer 250 (e.g., a silicon oxide layer or a silicon nitride layer) acts as a protective layer. In one or more embodiments, the resistance reducing layer 250 (e.g., a silicon oxide layer or a silicon nitride layer) prevents migration of conical grains formed in the bit line stack 200.

In some embodiments, the bit line stack 200 comprises a conductive layer 260. The conductive layer 26 can be deposited by any suitable technique known to the skilled artisan. In some embodiments, conductive layer 260 comprises one or more of tungsten (W), ruthenium (Ru), iridium (Ir), platinum (Pt), rhodium (Rh) or molybdenum (Mo). In some specific embodiments, the conductive layer 260 comprises or consists essentially of one or more of ruthenium (Ru) or tungsten (W).

The thickness of the conductive layer 260 can be varied. In some embodiments, the conductive layer 260 has a thickness greater than or equal to 50 Å. In some embodiments, the conductive layer 260 has a thickness greater than or equal to 200 Å. In some embodiments, conductive layer 260 has a thickness in a range of about 100 Å to about 300 Å, or in the range of about 120 Å to about 250 Å, or in the range of about 140 Å to about 200 Å, or in the range of about 160 Å to about 180 Å.

The conductive layer 260 can be deposited by any suitable technique known to the skilled artisan. In some embodiments, the conductive layer 260 is deposited by one or more of chemical vapor deposition (CVD), atomic layer deposition (ALD) or physical vapor deposition (PVD). Referring now to FIG. 3, a method 300 of forming bit line stack 200 is shown. The method 300 comprises, at operation 310, forming an adhesion layer on a polysilicon layer (also referred to as a substrate) as described herein. The method comprises, at operation 320, forming a barrier metal layer as described herein on the adhesion layer. At operation 330, the method 300 comprises forming an interface layer as described herein on the barrier metal layer. At operation 340, the method 300 comprises forming a resistance reducing layer (e.g., a silicon oxide layer) as described herein on the interface layer. At operation 350, the method 300 comprises forming a conductive layer as described herein on the resistance reducing layer (e.g., a silicon oxide layer or a silicon nitride layer).

In one or more embodiments, at operation 340, the method 300 includes one or more process parameters. In one or more embodiments, at operation 340, the method 300 includes flowing one or more of a process gas or an inert gas. In one or more embodiments, a flow rate of the one or more of the process gas or the inert gas can be any suitable flow rate, including but not limited to a flow rate of less than or equal to 200 sccm. In some embodiments, the flow rate is less than 175 sccm, less than 150 sccm, less than 125 sccm, less than 100 sccm, less than 75 sccm, less than 50 sccm, less than 40 sccm, less than 30 sccm, less than 20 sccm, less than 10 sccm, less than 5 sccm, or less than 1 sccm.

In some embodiments, the resistance reducing layer 250 (e.g., a silicon oxide layer or a silicon nitride layer) is formed under a pressure in a range of from 0.1 mTorr to 5 mTorr. In some embodiments, the resistance reducing layer (e.g., a silicon oxide layer) is formed using from 100 to 10,000 watts of direct current (DC) power. In some embodiments, the resistance reducing layer 250 (e.g., a silicon oxide layer or a silicon nitride layer) is formed using radio frequency (RF) power. In some embodiments, the resistance reducing layer 250 (e.g., a silicon oxide layer or a silicon nitride layer) is formed using from 100 to 10,000 watts of RF power.

In one or more embodiments, at operation 350, the method 300 optionally includes performing a post-deposition anneal process. In some embodiments, the post-deposition anneal process is performed at a temperature of at least 500° C. In some embodiments, the post-deposition anneal process is performed at a temperature of at least 650° C.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a bit line stack, the method comprising:
    forming an adhesion layer on a polysilicon layer;
    forming a barrier metal layer on the adhesion layer;
    forming an interface layer on the barrier metal layer;
    forming a silicon oxide resistance reducing layer directly on the interface layer; and
    forming a conductive layer over the silicon oxide resistance reducing layer.

2. The method of claim 1, wherein the silicon oxide resistance reducing layer has a thickness in a range of from 2 Å to 30 Å.

3. The method of claim 1, wherein the bit line stack has a resistance at least 5% lower than a comparable bit line stack without the silicon oxide resistance reducing layer.

4. The method of claim 1, wherein the silicon oxide resistance reducing layer is formed using one or more of a physical vapor deposition (PVD), a radio frequency-PVD, a pulsed-PVD, chemical vapor deposition (CVD), atomic layer deposition (ALD) or sputtering process.

5. The method of claim 4, wherein the silicon oxide resistance reducing layer is formed using a PVD process comprising a silicon target and an oxygen plasma.

6. The method of claim 4, wherein the silicon oxide resistance reducing layer is formed using a PVD process comprising a silicon oxide target and a plasma comprising one or more of argon (Ar), krypton (Kr) or neon (Ne).

7. The method of claim 1, further comprising performing a post-deposition anneal process at a temperature of at least 500° C.

8. The method of claim 1, wherein the adhesion layer comprises one or more of titanium (Ti), tantalum (Ta), titanium silicide (TiSi), tantalum silicide (TaSi) or cobalt silicide (CoSi).

9. The method of claim 8, wherein the adhesion layer comprises titanium.

10. The method of claim 9, wherein the adhesion layer has a thickness in a range of from 10 Å to 30 Å.

11. The method of claim 1, wherein the barrier metal layer comprises tungsten nitride.

12. The method of claim 11, wherein the barrier metal layer has a thickness in a range of from 10 Å to 30 Å.

13. The method of claim 1, wherein the interface layer comprises one or more of tungsten silicide (WSi) or tungsten silicon nitride (WSiN).

14. The method of claim 1, wherein the interface layer has a thickness in a range of from 10 Å to 30 Å.

15. The method of claim 1, wherein the conductive layer comprises one or more of tungsten (W), ruthenium (Ru), iridium (Ir), molybdenum (Mo), platinum (Pt) or rhodium (Rh).

16. The method of claim 1, wherein the conductive layer has a thickness greater than or equal to 50 Å.

* * * * *